(12) United States Patent
Chen et al.

(10) Patent No.: US 12,358,782 B2
(45) Date of Patent: Jul. 15, 2025

(54) PIEZOELECTRIC MICROELECTROMECHANICAL SYSTEM MICROPHONE SENSITIVITY IMPROVEMENT BY ANCHOR ENGINEERING

(71) Applicant: SKYWORKS SOLUTIONS, INC., Irvine, CA (US)

(72) Inventors: Guofeng Chen, Fremont, CA (US); Yu Hui, Merced, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 533 days.

(21) Appl. No.: 17/674,213

(22) Filed: Feb. 17, 2022

(65) Prior Publication Data

US 2022/0267141 A1    Aug. 25, 2022

Related U.S. Application Data

(60) Provisional application No. 63/151,318, filed on Feb. 19, 2021.

(51) Int. Cl.
*B81B 3/00*     (2006.01)
*H04R 17/02*    (2006.01)

(52) U.S. Cl.
CPC .......... *B81B 3/0051* (2013.01); *B81B 3/0021* (2013.01); *B81B 2201/0257* (2013.01); *H04R 17/02* (2013.01); *H04R 2201/003* (2013.01)

(58) Field of Classification Search
CPC .......... B81B 3/0051; B81B 2201/0257; B81B 3/0021; H04R 2201/003; H04R 17/02
See application file for complete search history.

(56) References Cited

U.S. PATENT DOCUMENTS

| 9,055,372 B2 | 6/2015 | Grosh et al. |
| 10,626,007 B2 | 4/2020 | Bretthauer et al. |

(Continued)

FOREIGN PATENT DOCUMENTS

| EP | 3557881 A1 | 10/2019 |
| JP | 2008118639 A | 5/2008 |
| JP | 2019140638 A | 8/2019 |

OTHER PUBLICATIONS

Mohamad et al., "Modelling and Optimisation of a Spring-Supported Diaphragm Capacitive MEMS Microphone", Engineering, 2010, 2, 762-770.

(Continued)

*Primary Examiner* — Patricia D Valenzuela
(74) *Attorney, Agent, or Firm* — Lando & Anastasi, LLP (57) ABSTRACT

A piezoelectric microelectromechanical system microphone comprises a support substrate, a piezoelectric element configured to deform and generate an electrical potential responsive to impingement of sound waves on the piezoelectric element, the piezoelectric element attached to the support substrate about a portion of a perimeter of the piezoelectric element, a sensing electrode disposed on the piezoelectric element and configured to sense the electrical potential, and slits defined in the piezoelectric element about the perimeter of the piezoelectric element, the slits defining a plurality of partial anchors securing the piezoelectric element to the support substrate to improve sensitivity of the piezoelectric microelectromechanical system microphone.

16 Claims, 9 Drawing Sheets

(56) References Cited

U.S. PATENT DOCUMENTS

| | | | |
|---|---|---|---|
| 10,964,880 | B2 | 3/2021 | Grosh et al. |
| 2008/0123878 | A1 | 5/2008 | Zhe et al. |
| 2009/0092273 | A1 | 4/2009 | Zhe et al. |
| 2011/0051985 | A1 | 3/2011 | Hwang et al. |
| 2013/0121509 | A1 | 5/2013 | Hsu et al. |
| 2016/0219374 | A1 | 7/2016 | Hall et al. |
| 2016/0219375 | A1 | 7/2016 | Hall et al. |
| 2017/0085994 | A1 | 3/2017 | Clerici et al. |
| 2017/0186940 | A1 | 6/2017 | Bevilacqua et al. |
| 2018/0091905 | A1 | 3/2018 | Clerici et al. |
| 2019/0281393 | A1 | 9/2019 | Grosh et al. |
| 2019/0327562 | A1* | 10/2019 | Cerini .................... H04R 17/02 |
| 2020/0148532 | A1 | 5/2020 | Grosh et al. |
| 2020/0351595 | A1 | 11/2020 | Rusconi Clerici Beltrami et al. |
| 2020/0382876 | A1 | 12/2020 | Cerini et al. |
| 2021/0051413 | A1 | 2/2021 | Hui et al. |
| 2021/0084423 | A1 | 3/2021 | Rusconi Clerici Beltrami et al. |
| 2021/0120346 | A1 | 4/2021 | Hui et al. |
| 2021/0136483 | A1 | 5/2021 | Hsieh et al. |
| 2021/0385584 | A1 | 12/2021 | Goswami et al. |
| 2022/0073342 | A1* | 3/2022 | Ho .......................... H04R 1/245 |
| 2022/0272459 | A1 | 8/2022 | Chen et al. |
| 2022/0332568 | A1 | 10/2022 | Barsukou |
| 2022/0402752 | A1 | 12/2022 | Goswami et al. |
| 2023/0007405 | A1 | 1/2023 | Qian et al. |
| 2023/0011561 | A1 | 1/2023 | Qian et al. |
| 2023/0012046 | A1 | 1/2023 | Qian et al. |
| 2023/0039743 | A1 | 2/2023 | Hui et al. |
| 2023/0072672 | A1 | 3/2023 | Chen et al. |
| 2023/0104257 | A1 | 4/2023 | Barsukou et al. |
| 2023/0105699 | A1 | 4/2023 | Chen et al. |
| 2023/0127983 | A1 | 4/2023 | Chen et al. |
| 2023/0188896 | A1 | 6/2023 | Barsukou |
| 2023/0234837 | A1 | 7/2023 | Chen et al. |
| 2023/0239641 | A1 | 7/2023 | Chen et al. |
| 2023/0303387 | A1 | 9/2023 | Barsukou |
| 2024/0098426 | A1 | 3/2024 | Barsukou |

OTHER PUBLICATIONS

Pena-Garcia et al., "Design and Modeling of a MEMS Dual-Backplate Capacitive Microphone with Spring-Supported Diaphragm for Mobile Device Applications", Sensors 2018, 18, 3345, Oct. 2018, 30 pages.

Shah et al., "Design Approaches of MEMS Microphones for Enhanced Performance", Hindawi, Journal of Sensors, vol. 2019, Article ID 9294528, Mar. 2019, 26 pages.

Chen et al. "Acoustic Transducers Built on Edge-released MEMS Structures," Solid-State Sensors, Actuators, and Microsystems Workshop Hilton Head Island, South Carolina, Jun. 6-10, 2010, pp. 234-237.

Chen et al., "Edge-released, piezoelectric MEMS acoustic transducers in array configuration," J. Micromech. Microeng. 22 (2012) 025005, pp. 1-9.

Huang et al., "High Sensitivity and High S/N Microphone Achieved by PZT Film with Central-Circle Electrode Design", IEEE, MEMS 2017, Las Vegas, NV, USA, Jan. 22-26, 2017, pp. 1188-1191.

Je et al., "In situ tuning of a MEMS microphone using electrodeposited nanostructures," Journal of Micromechanics and Microengineering, 19 (2009) 035015, pp. 1-8.

Je et al., "MEMS Capacitive Microphone with Dual-Anchored Membrane", Proceedings 2017, 1, 342; Aug. 9, 2017.

Knisely et al., "Method for Controlling Stress Gradients in PVD Aluminum Nitride", Journal of Micromechanics and Microengineering, vol. 28, No. 11, 2018.

Littrell, "High Performance Piezoelectric MEMS Microphones", A dissertation submitted in partial fulfillment of the requirements for the degree of Doctor of Philosophy (Mechanical Engineering) in The University of Michigan, 2010, 111 pages.

Lo et al., "Development of a No-Back-Plate SOI MEMS Condenser Microphone," IEEE, Transducers 2015, Anchorage, Alaska, Jun. 21-25, 2015, pp. 1085-1088.

Lo et al., "Sensitivity Improvement of No-Back-Plate MEMS Microphone Using Polysilicon Trench-refilled Process," IEEE, Transducers 2017, Kaohsiung, Taiwan, Jun. 18-22, 2017, pp. 1171-1174.

Pulskamp et al. "Mitigation of residual film stress deformation in multilayer microelectromechanical systems cantilever devices." Journal of Vacuum Science & Technology B: Microelectronics and Nanometer Structures Processing, Measurement, and Phenomena 21.6 (2003): 2482-2486.

Segovia-Fernandez et al., "Monolithic Piezoelectric Aluminum Nitride MEMS-CMOS Microphone", IEEE (2017), Transducers 2017, Kaohsiung, Taiwan, Jun. 18-22, 2017, pp. 414-417.

Udvardi et al., Spiral-Shaped Piezoelectric MEMS Cantilever Array for Fully Implantable Hearing Systems. Micromachines (2017) 8, 311, 13 pages.

Williams et al., "An AlN MEMS Piezoelectric Microphone for Aeroacoustics Applications", Journal of Microelectromechanical Systems, vol. 21, No. 2, Apr. 2012, pp. 270-283.

Yamashita et al., "Diaphragm deflection control of piezoelectric ultrasonic microsensors for sensitivity improvement", Sensors and Actuators A 139 (2007), pp. 118-123.

Yan et al., "Corrugated Diaphragm for Piezoelectric Microphone", IEEE, 1996, pp. 503-506.

* cited by examiner

PIEZOELECTRIC MICROELECTROMECHANICAL SYSTEM MICROPHONE SENSITIVITY IMPROVEMENT BY ANCHOR ENGINEERING

CROSS-REFERENCE TO RELATED APPLICATIONS

This application claims priority under 35 U.S.C. § 119(e) to U.S. Provisional Patent Application Ser. No. 63/151,318, titled "PIEZOELECTRIC MICROELECTROMECHANICAL SYSTEM MICROPHONE SENSITIVITY IMPROVEMENT BY ANCHOR ENGINEERING," filed Feb. 19, 2021, the entire contents of which being incorporated herein by reference for all purposes.

BACKGROUND

Technical Field

Embodiments disclosed herein relate to piezoelectric microelectromechanical system microphones and to devices including same.

Description of Related Technology

A microelectromechanical system (MEMS) microphone is a micro-machined electromechanical device to convert sound pressure (e.g., voice) into an electrical signal (e.g., voltage). MEMS microphones are widely used in mobile devices such as cellular telephones, headsets, smart speakers, and other voice-interface devices/systems. Capacitive MEMS microphones and piezoelectric MEMS microphones (PMMs) are both available in the market. PMMs requires no bias voltage for operation, therefore, they provide lower power consumption than capacitive MEMS microphones. The single membrane structure of PMMs enable them to generally provide more reliable performance than capacitive MEMS microphones in harsh environments. Existing PMMs are typically based on either cantilever MEMS structures or diaphragm MEMS structures.

SUMMARY

In accordance with one aspect, there is provided a piezoelectric microelectromechanical system microphone. The piezoelectric microelectromechanical system microphone comprises a support substrate, a piezoelectric element configured to deform and generate an electrical potential responsive to impingement of sound waves on the piezoelectric element, the piezoelectric element attached to the support substrate about a portion of a perimeter of the piezoelectric element, a sensing electrode disposed on the piezoelectric element and configured to sense the electrical potential, and slits defined in the piezoelectric element about the perimeter of the piezoelectric element, the slits defining a plurality of partial anchors securing the piezoelectric element to the support substrate to improve sensitivity of the piezoelectric microelectromechanical system microphone.

In some embodiments, the piezoelectric element has a diaphragm structure.

In some embodiments, the piezoelectric element is circular.

In some embodiments, the slits define at least three partial anchors.

In some embodiments, the slits are arcuate in shape.

In some embodiments, the plurality of partial anchors each extends over an arc length between 0° and 360°/N, where N is a total number of partial anchors in the piezoelectric microelectromechanical system microphone.

In some embodiments, the sensing electrode includes an inner sensing electrode disposed proximate a center of the diaphragm structure and an outer sensing electrode disposed proximate the perimeter of the diaphragm structure.

In some embodiments, the slits are defined in a region of the piezoelectric element surrounding the outer sensing electrode.

In some embodiments, the piezoelectric element is free of vent holes within a region inside a perimeter defined by the outer sensing electrode.

In some embodiments, the inner sensing electrode includes a first upper sensing electrode disposed on an upper surface of the piezoelectric element and a first lower sensing electrode disposed on a lower surface of the piezoelectric element.

In some embodiments, the outer sensing electrode includes a second upper sensing electrode disposed on the upper surface of the piezoelectric element and a second lower sensing electrode disposed on the lower surface of the piezoelectric element.

In some embodiments, the piezoelectric element includes an upper film of piezoelectric material and a lower film of piezoelectric material, an inner middle sensing electrode disposed between the upper film and lower film proximate the center of the diaphragm structure, and an outer middle sensing electrode disposed proximate the perimeter of the diaphragm structure.

In some embodiments, the slits are between 1 μm and 5 μm wide.

In some embodiments, the piezoelectric microelectromechanical system is included in an electronics device module.

In some embodiments, the electronics device module is included in an electronic device.

In some embodiments, the electronics device module is included in a telephone.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Figure 1A:
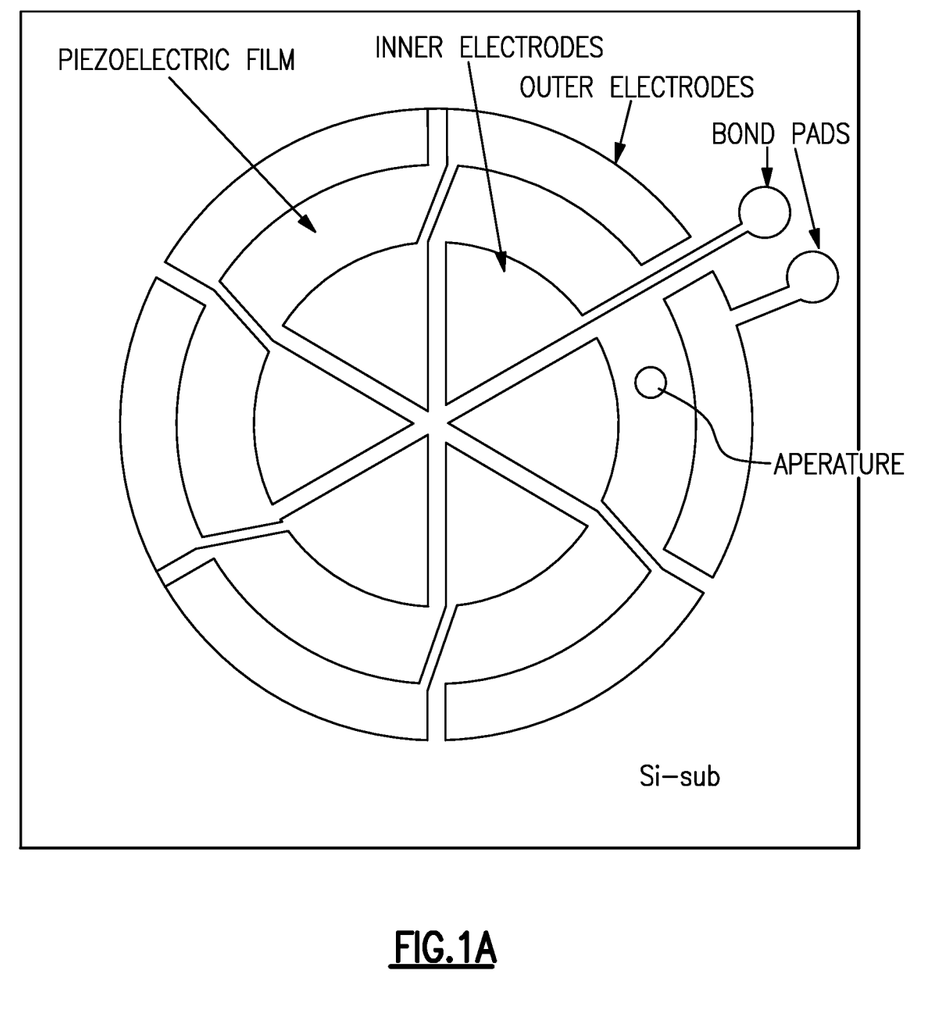
FIG. 1A is a plan view of an example of a diaphragm PMM.
Figure 1B:
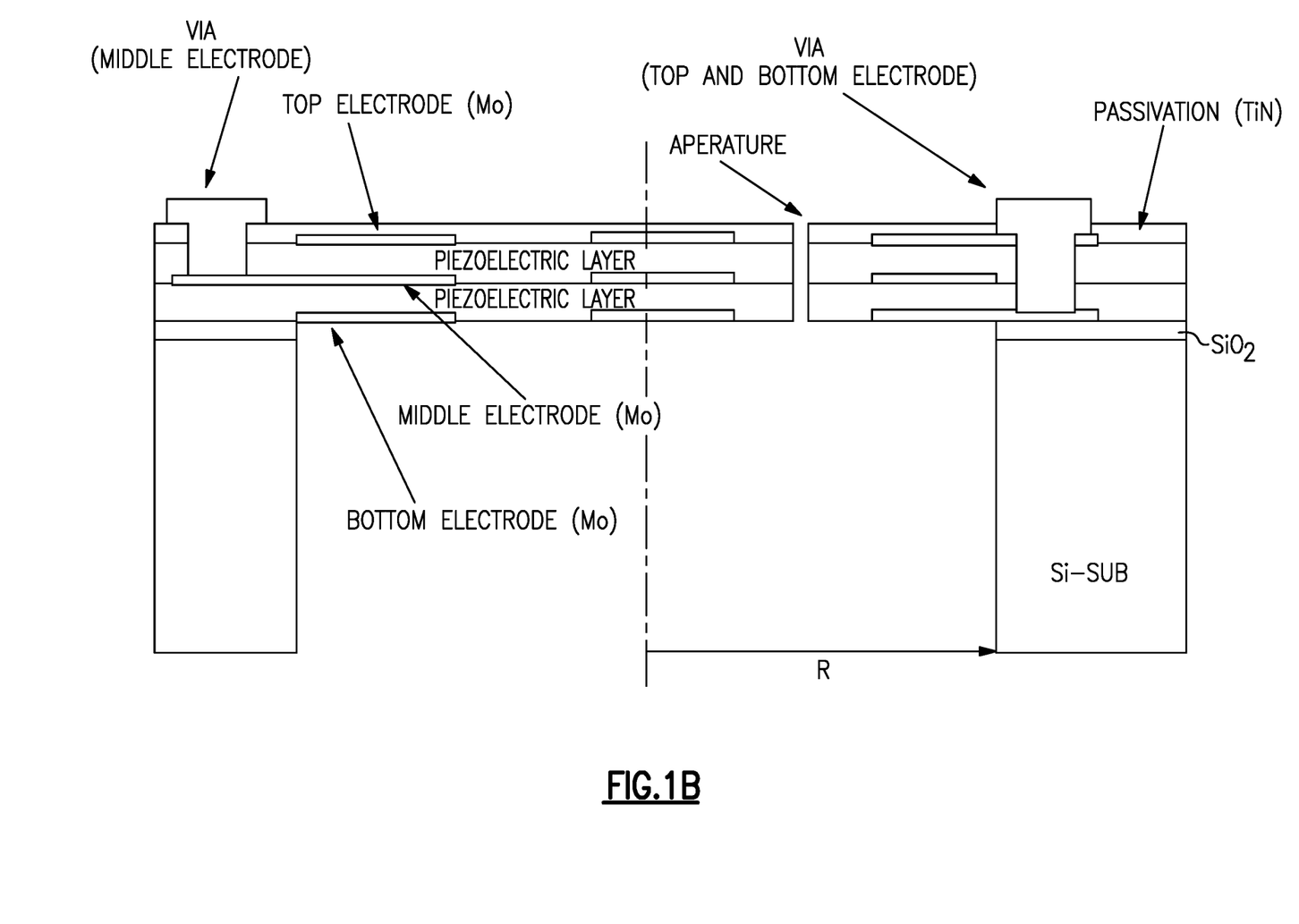
FIG. 1B is a cross-sectional view of the diaphragm PMM of FIG. 1A.

An example of a diaphragm-type piezoelectric microelectromechanical system microphone PMM is illustrated in a top-down plan view in FIG. 1A and in cross-sectional view in FIG. 1B.

The diaphragm may be formed of a piezoelectric material, for example, aluminum nitride (AlN), that generates a voltage difference across different portions of the diaphragm when the diaphragm deforms or vibrates due to the impingement of sound waves on the diaphragm. Although illustrated as circular in FIG. 1A, the diaphragm may have a circular, rectangular, or polygonal shape. In the example of FIGS. 1A and 1B, the diaphragm structure is fully clamped all around its perimeter by adhesion of the entire perimeter of the diaphragm to a layer of $SiO_2$ disposed on a Si substrate. This is referred to herein as a "full anchor" structure. To improve low-frequency roll-off control ($f_{-3\ dB}$ control) one or more vent holes or apertures may be formed in the diaphragm structure that may be well defined by photolithography.

The circular diaphragm PMM of FIGS. 1A and 1B has a circular diaphragm formed of two layers of piezoelectric material, for example, AlN, that is clamped at its periphery on layers of $SiO_2$ formed on a Si substrate with a cavity defined in the substrate below the diaphragm. The circular diaphragm PMM includes a plurality of pie-piece shaped sensing/active inner electrodes disposed in the central region of the diaphragm that are segmented and separated from one another by gaps. Outer sensing/active electrodes, segmented and separated circumferentially from one another by gaps, are positioned proximate a periphery of the diaphragm and extend inward from the clamped periphery a partial of the radius of the diaphragm toward the inner electrodes. Each outer sensing electrode is directly electrically connected to a corresponding inner sensing electrode by an electrical trace or conductor segment. Open areas that are free of sensing/active electrodes are defined between the inner electrodes and outer electrodes.

The inner electrodes and outer electrodes each include top or upper electrodes disposed on top of an upper layer of piezoelectric material of the diaphragm, bottom or lower electrodes disposed on the bottom of the lower layer of piezoelectric material of the diaphragm, and middle electrodes disposed between the upper and lower layers of piezoelectric material. The multiple inner and outer electrodes are electrically connected in series between the two bond pads, except for inner and outer electrode segment pairs having electrical connection directly to the bond pads. The top and bottom electrodes of each inner and outer electrode segment pair are electrically connected to the middle electrode in an adjacent inner and outer electrode segment pair. Vias to the middle electrode of one inner and outer electrode segment pair and to the top and bottom electrodes of an adjacent inner and outer electrode segment pair are used to provide electrical connection between the bond pads and electrodes. The electrodes are indicated as being Mo, but could alternatively be Ru or any other suitable metal, alloy, or non-metallic conductive material.

Diaphragm structures generate maximum stress and piezoelectric charges in the center and near the edge of the diaphragm anchor. The charges in the center and edge have opposite polarities. Additionally, diaphragm structures generate piezoelectric charges at the top and the bottom surfaces and the charge polarities are opposite on the top and bottom surfaces in the same area. Partial sensing electrodes in the diaphragm center and near the anchor may be used for maximum output energy and sensitivity and to minimize parasitic capacitance.

A diaphragm PMM may include one, two, or multiple piezoelectric material film layers in the diaphragm. In embodiments including two piezoelectric material film layers, conductive layers forming sensing/active electrodes may be deposited on the top and the bottom of the diaphragm, as well as between the two piezoelectric material film layers, forming a bimorph diaphragm structure. Partial sensing electrodes may be employed. Inner electrodes may be placed in the center of diaphragm and outer electrodes may be placed near the anchor/perimeter of the diaphragm. Sensing/active electrodes may be placed on the bottom and top, and in the middle of the vertical extent of the multi-layer piezoelectric film forming the diaphragm. The size of the sensing/active electrodes may be selected to collect the maximum output energy ($E=0.5*C*V^2$).

It has been discovered that the sensitivity of a diaphragm PMM may be improved by partially etching the diaphragm at anchor regions proximate where it is adhered to its supporting substrate so that it is not fully clamped all around its perimeter by adhesion of the entire perimeter of the diaphragm to its supporting substrate. Such a structure is referred to herein as a partial anchor diaphragm PMM.

Figure 2A:
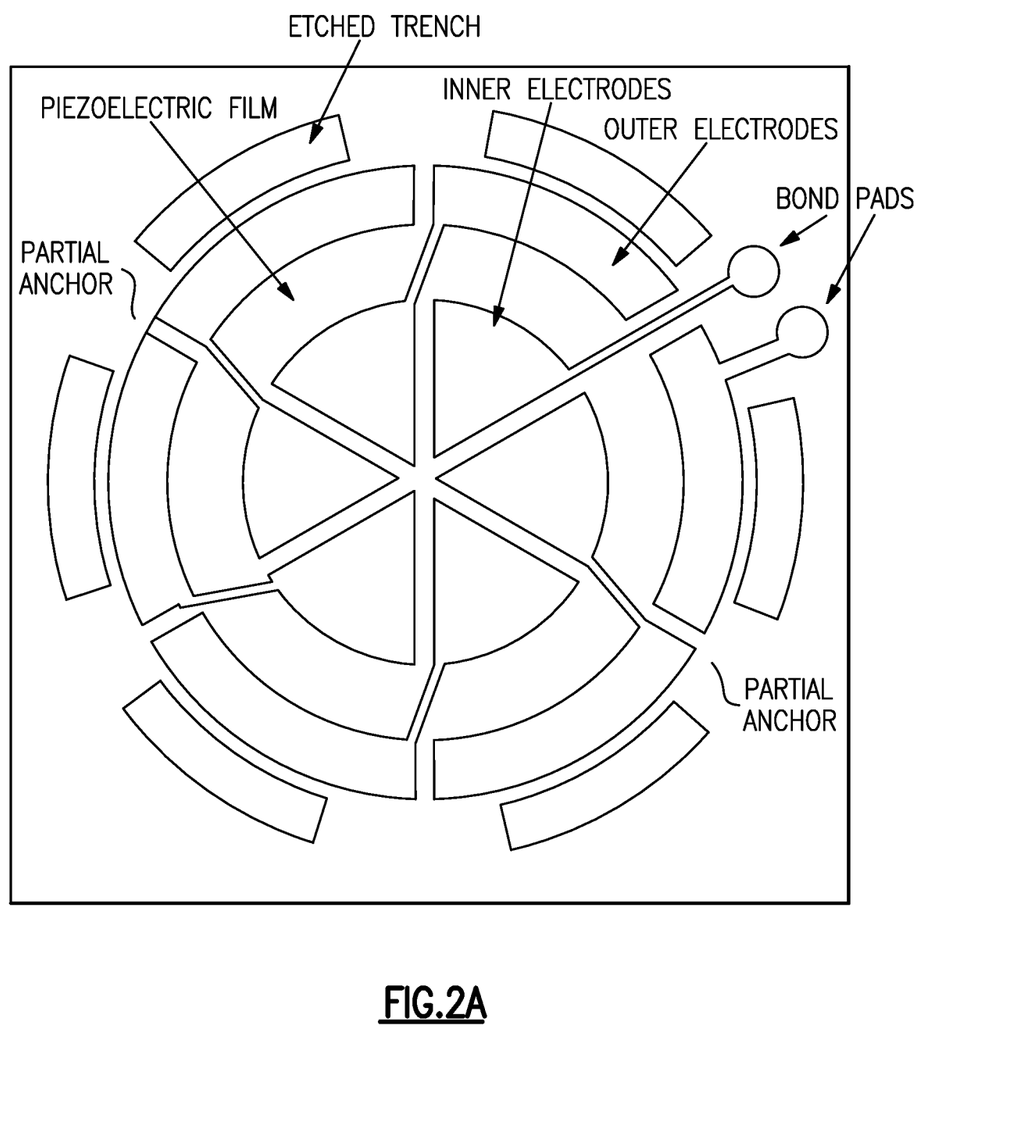
FIG. 2A is a plan view of an example of a diaphragm PMM including partially etched anchors.
Figure 2B:
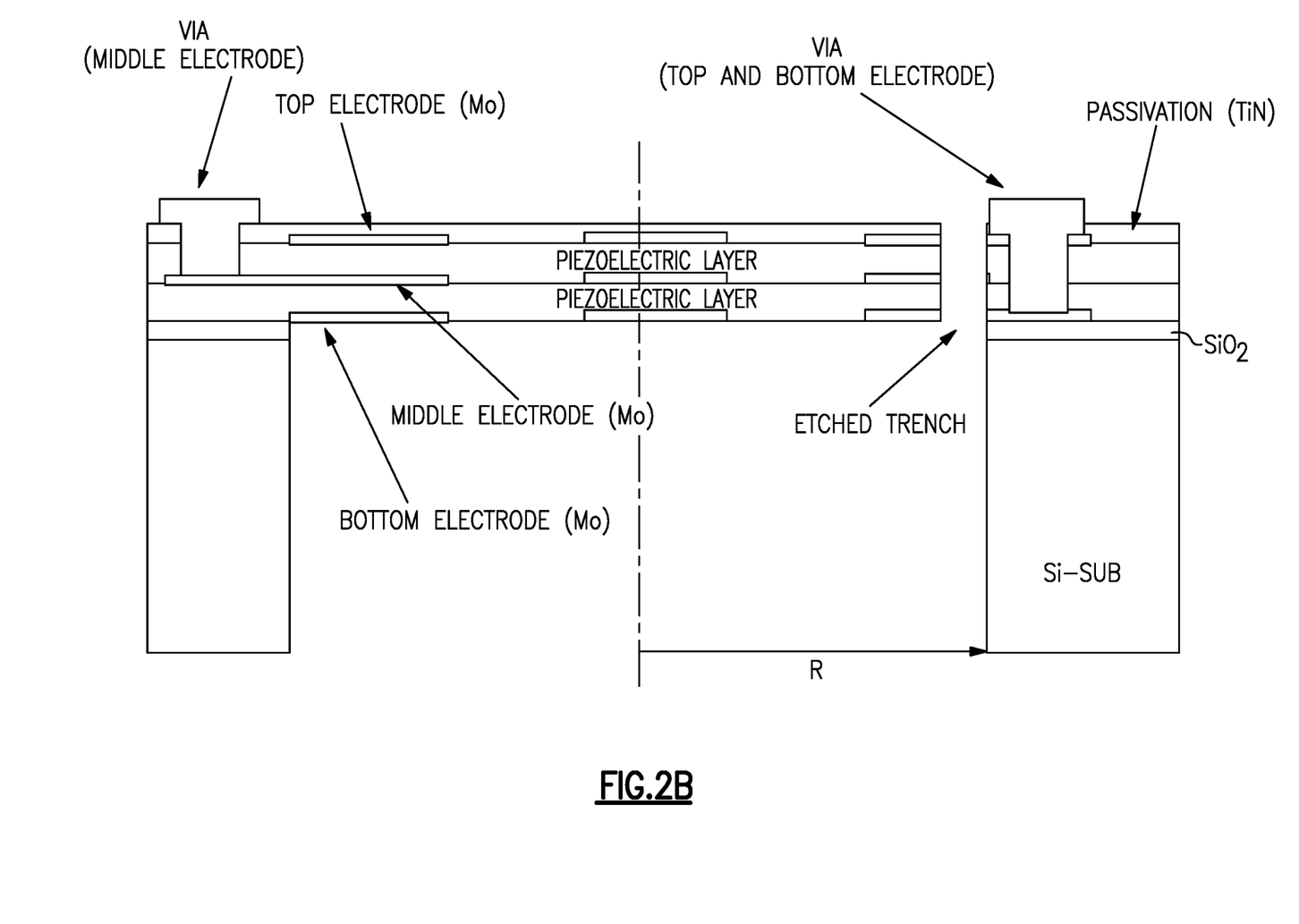
FIG. 2B is a cross-sectional view of the diaphragm PMM of FIG. 2A.

One example of a partial anchor diaphragm PMM is illustrated in a top-down plan view in FIG. 2A and in a cross-sectional view in FIG. 2B. As illustrated in FIGS. 2A and 2B, a series of partially circumferential trenches or slits are etched through the diaphragm, including through the piezoelectric material, passivation, and electrodes, at anchor regions adjacent to where the diaphragm would otherwise be attached to the support substrate (e.g., to the $SiO_2$ film on top of the Si substrate). The portions of the diaphragm structure remaining attached to the support substrate circumferentially between the etched trenches may be referred to as partial anchors. In some embodiments, the reduced mechanical robustness of the PMM due to the partial anchor structure may be compensated for by anchor reinforcement. The partial anchors may, for example, be formed of a thicker material than the remainder of the piezoelectric element by, for example, depositing additional layers of material on the partial anchors than on the central region of the diaphragm radially inside of the partial anchors.

The example of FIGS. 2A and 2B includes six etched trenches and six partial anchors, but other embodiments may have greater or fewer numbers of etched trenches and partial anchors. Each of the etched trenches has a same shape, including arc length and radial width. The radial width of each etched trench may be just sufficient to keep the edges of the diaphragm inside of the etched trenches from contacting the remaining material attached on the outside of the etched trenches, given the tolerances of a manufacturing process used to fabricate the PMM. The radial width of each etched trench may be, for example, between 1 µm and 5 µm wide, although this range is not intended to be limiting. The partial anchors may also each have the same shape, including arc length and radial width. In embodiments with six etched trenches and six partial anchors, with each etch trench having the same size and shape and each partial anchor having the same size and shape, the arc length of each partial anchor may be between 0° and 60°. A partial anchor arc length of 0° would correspond to the diaphragm being completely detached from the support substrate. A partial anchor arc length of 60° would correspond to a full anchor diaphragm as illustrated in FIGS. 1A and 2A.

In other embodiments, one or more of the etched trenches may have a different width or arc length than one or more other of the etched trenches and/or one or more of the partial anchors may have a different width or arc length than one or more other of the partial anchors.

Figure 3A:
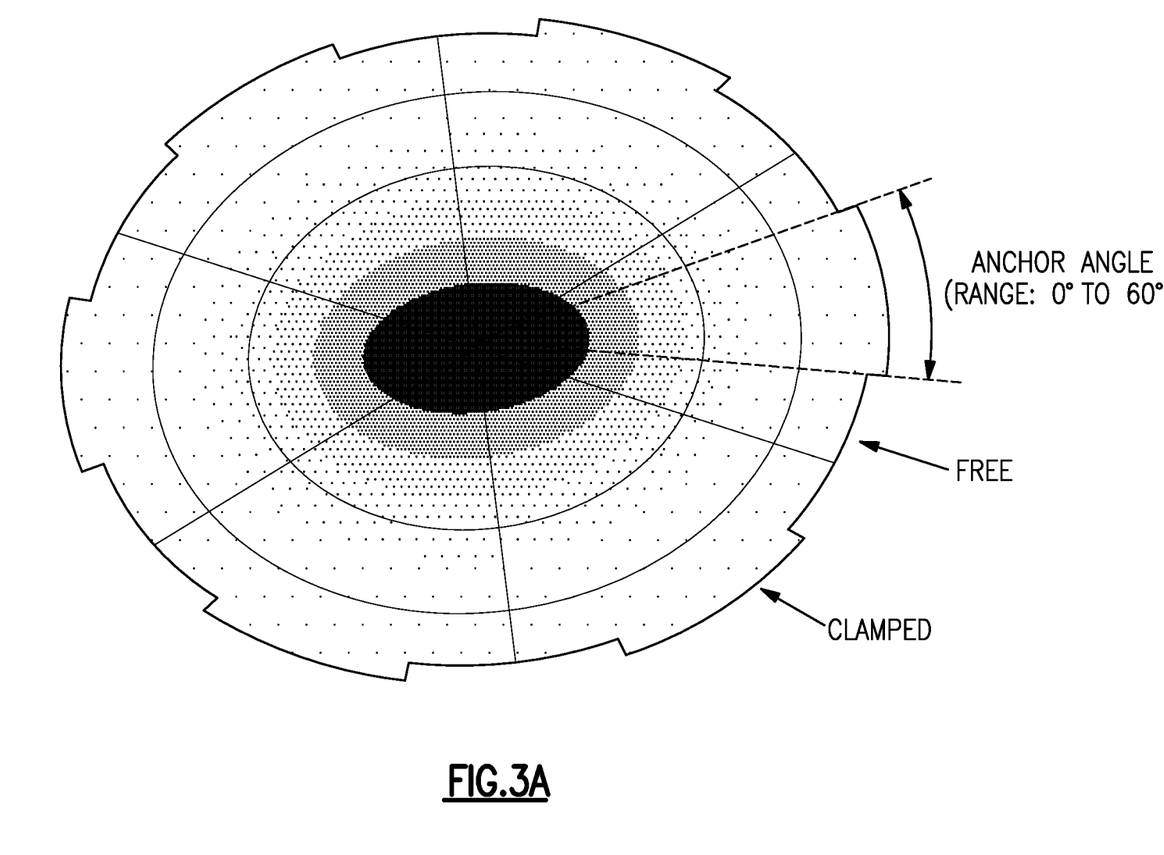
FIG. 3A illustrates displacement of the membrane of a diaphragm PMM with partially etched anchors.

The etched trench/partial anchor structure may provide for the diaphragm to more easily be displaced/vibrated by impingement of sound waves on the diaphragm, thus increasing its sensitivity. FIG. 3A illustrates a vibration al mode of a diaphragm of a PMM having etched trenches and partial anchors as disclosed herein with two 300 nm thick layers of AlN as the piezoelectric material and an anchor trench width of 10 µm.

Figure 3B:
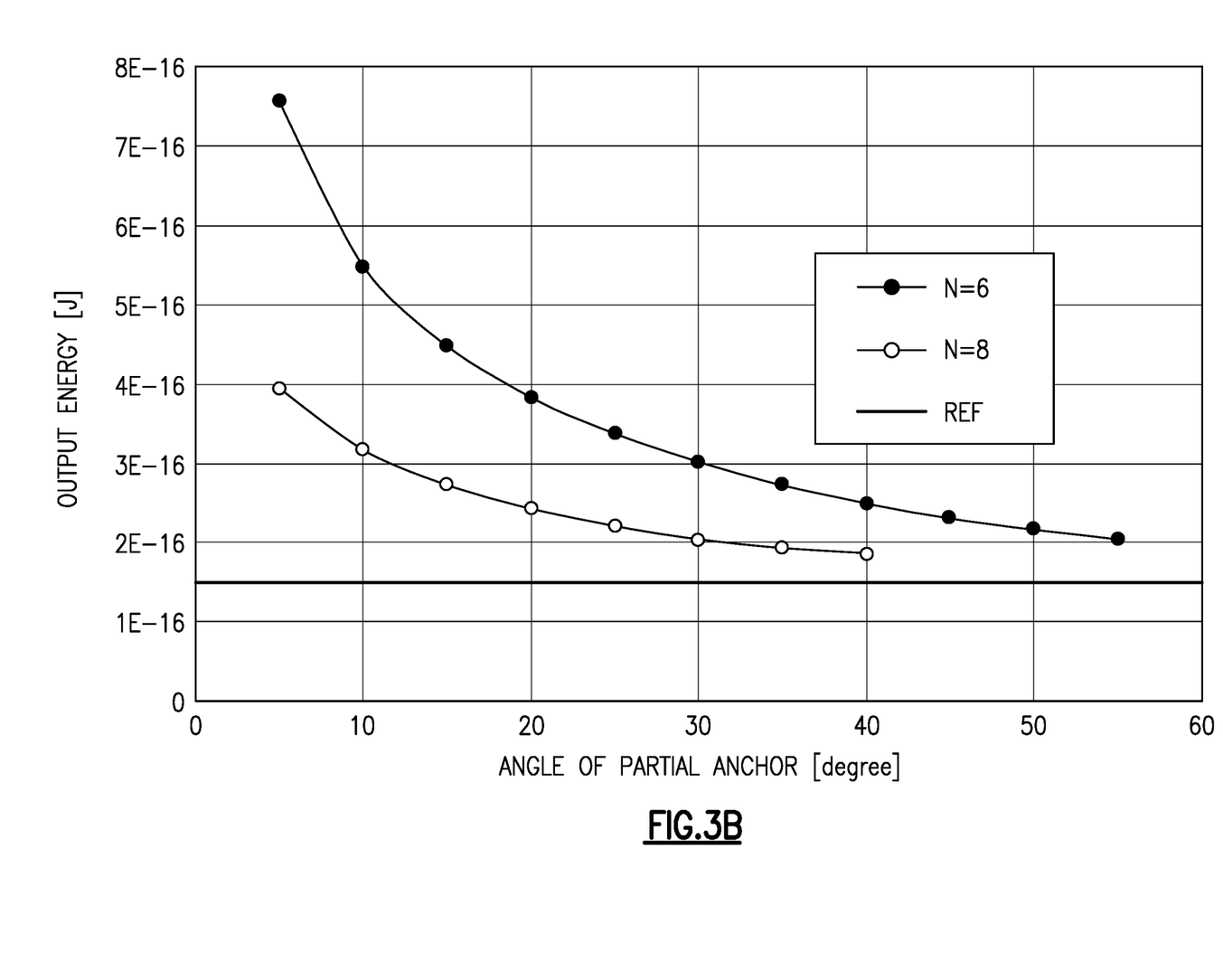
FIG. 3B is a chart of output energy from the inner and outer electrodes of PMM with partially etched anchors as a function of arc length of the partial anchors and number of partial anchors and compared to the output voltage of the electrodes of a PMM with fully clamped anchors at a given sound intensity.

A chart illustrating output energy in Joules from the electrodes of a partial anchor PMM (PA PMM) having either six (the "N=6" curve) or eight (the "N=8" curve) each of partial anchors and etched trenches as a function of partial anchor arc length in angles is illustrated in FIG. 3B. The data in the chart of FIG. 3B was obtained from a simulation assuming a sound pressure of one Pa. The output energy for the electrodes of a full anchor PMM (the "REF" curve) having similar dimensions as the PA PMM is also shown in FIG. 3B for comparison. At longer anchor arc lengths, for example, an arc length approaching 60° for the PMM having six partial anchors and an arc length approaching 45° for the PMM having eight partial anchors, the output energies of the PA PMMs approach that of the full anchor PMM. At anchor arc lengths of less than 60° the output energy of the PA PMM with six partial anchors exceeds the output energy of the full anchor PMM. At anchor arc lengths of less than 45° the output energy of the PA PMM with eight partial anchors exceeds the output energy of the full anchor PMM. As the anchor arc lengths decreases for both the PMM having six partial anchors for the PMM having eight partial anchors the output energies increased relative to the output energy of the full anchor PMM. This increase in output energies is, without being bound to a particular theory, likely due to increased displacement of the center of the diaphragms of the PA PMMs as a result of less restrictive binding to the support substrate and thus greater compliance. The output energy of the electrodes of the PA PMM having six partial anchors increases by about five times as compared to the full anchor PMM as the anchor arc length approaches 5°. The output energy of the electrodes of the PA PMM having eight partial anchors increases by over two and a half times as compared to the full anchor PMM as the anchor arc length approaches 5°. The increased output energy directly translates to increased output sensitivity, assuming the same output capacitance.

Figure 3C:
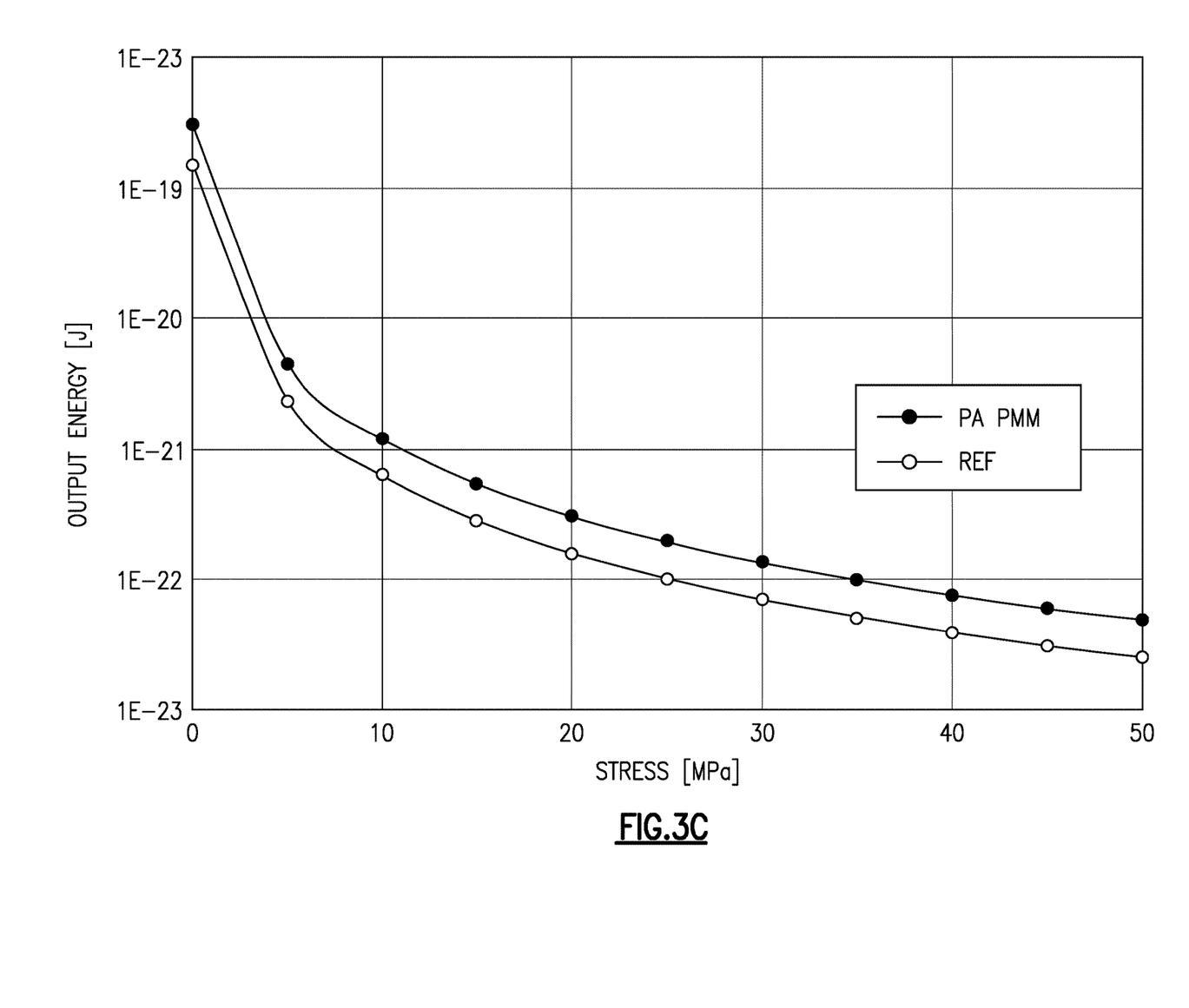
FIG. 3C is a chart of output sensitivity degradation due to residual stress in a PMM with partial anchors as compared to a PMM with full anchors.

Forming a PMM with partial anchors also has the advantage of reducing the degradation in output sensitivity due to residual stresses that may remain in the piezoelectric membrane as a result of the manufacturing process. FIG. 3C is a chart of output sensitivity degradation due to residual stress in a PMM with six partial anchors each spanning a 30° arc (half of the perimeter being clamped to the support substrate) as compared to a PMM with full anchors and having equivalent dimensions. The output energy for the partial anchor PMM is twice the output energy of the full anchor PMM at a residual stress value of 50 MPa.

Figure 3D:
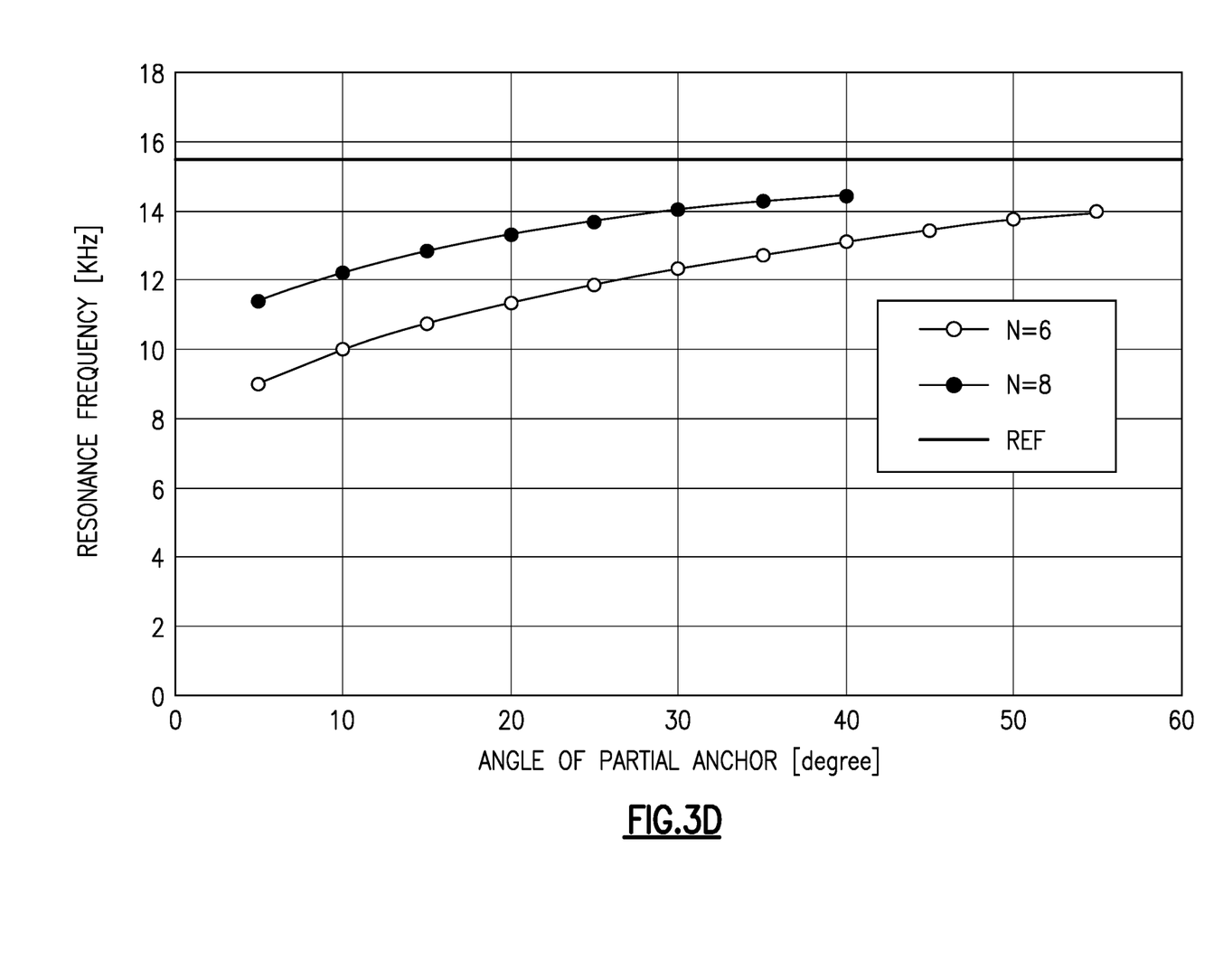
FIG. 3D is a chart of resonance frequency of a PMM with partially etched anchors as a function of arc length of the partially etched anchors and compared to a full anchor PMM.
Figure 4:
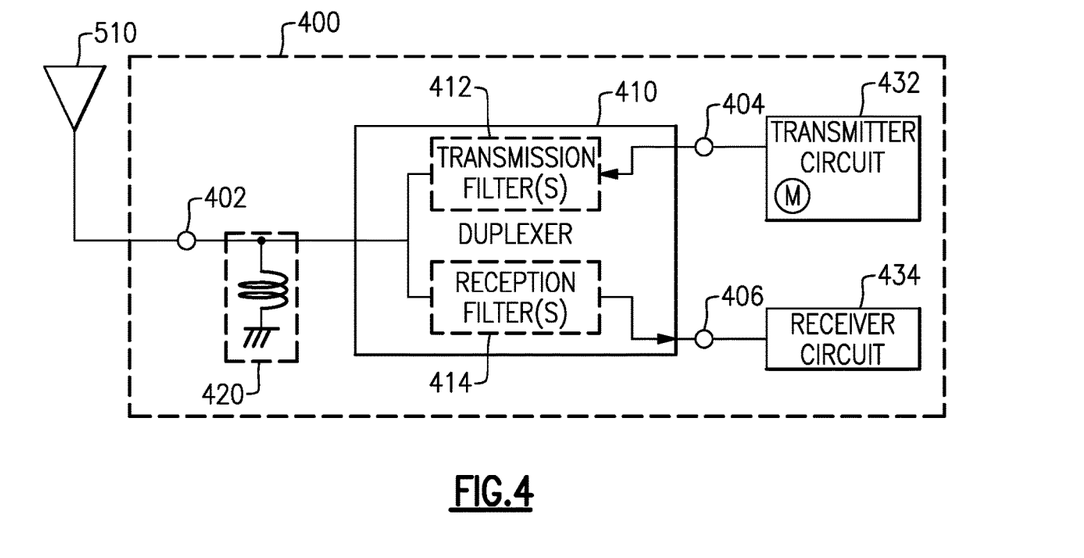
FIG. 4 is a block diagram of one example of a front-end module that can include one or more PMMs according to aspects of the present disclosure.
Figure 5:
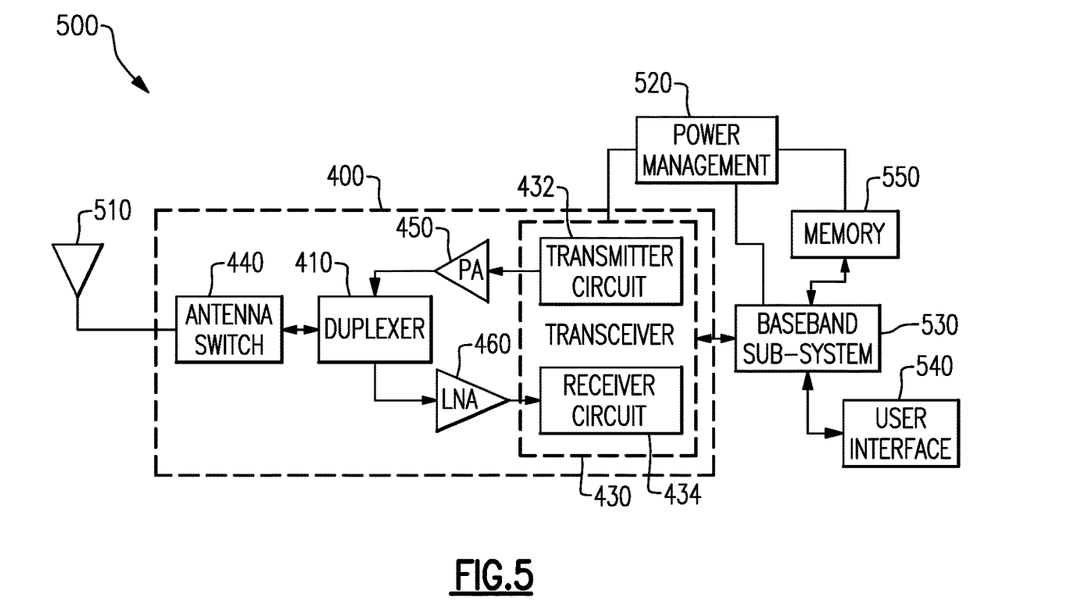
FIG. 5 is a block diagram of one example of a wireless device including the front-end module of FIG. 4.

The increase in output energy of a partial anchor PMM with reduced anchor arc length does have a tradeoff. As illustrated in FIG. 3D, as the anchor arc length of the partial anchor PMM decreases, so does its resonant frequency, that is related to bandwidth of the PMM. The higher the output energy is, the lower the bandwidth will be. Therefore, there is a tradeoff between output energy and bandwidth. This effect is greater for a partial anchor PMM with a lesser rather than a grater number of partial anchors, as can be seen by comparing the curve for a PMM with six partial anchors (the "N=6" curve) to the curve for a PMM with eight partial anchors (the "N=8" curve). The simulated PMMs used to generate the data in FIG. 3D had anchor widths (radial dimensions) of 20 µm.

Examples of MEMS microphones as disclosed herein can be implemented in a variety of packaged modules and devices. Some example packaged modules will now be discussed in which any suitable principles and advantages of the PMMs discussed herein can be implemented. FIGS. 11 and 12 are schematic block diagrams of illustrative packaged modules and devices according to certain embodiments.

Referring to FIG. 11, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 may include a microphone M, which may be any one or more of the embodiments of PMMs disclosed herein. The transmitter circuit 432 may generate signals for transmission via the antenna 510, and the receiver circuit 434 can receive and process signals received via the antenna 510. In some embodiments, the receiver and transmitter circuits are implemented as separate components, as shown in FIG. 11, however, in other embodiments these components may be integrated into a common transceiver circuit or module. As will be appreciated by those skilled in the art, the front-end module 400 may include other components that are not illustrated in FIG. 11 including, but not limited to, switches, electromagnetic couplers, amplifiers, processors, and the like.

FIG. 12 is a block diagram of one example of a wireless device 500 including the antenna duplexer 410 shown in FIG. 11. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 11. The front-end module 400 includes the duplexer 410, as discussed above. In the example shown in FIG. 12 the front-end module 400 further includes an antenna switch 440, which can be configured to switch between different frequency bands or modes, such as transmit and receive modes, for example. In the example illustrated in FIG. 12, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 12.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 12, the front-end module 400 may further include a low noise amplifier module 460, which amplifies received signals from the antenna 510 and provides the amplified signals to the receiver circuit 434 of the transceiver 430.

The wireless device 500 of FIG. 12 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets.

The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 10 GHz, such as in the X or Ku 5G frequency bands.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A piezoelectric microelectromechanical system microphone comprising:
   a support substrate;
   a piezoelectric element configured to deform and generate an electrical potential responsive to impingement of sound waves on the piezoelectric element, the piezoelectric element attached to the support substrate about a portion of a perimeter of the piezoelectric element;
   a sensing electrode disposed on the piezoelectric element and configured to sense the electrical potential; and
   slits defined in the piezoelectric element about the perimeter of the piezoelectric element, the slits defining a plurality of partial anchors securing the piezoelectric element to the support substrate to improve sensitivity of the piezoelectric microelectromechanical system microphone.

2. The piezoelectric microelectromechanical system microphone of claim 1 wherein the piezoelectric element has a diaphragm structure.

3. The piezoelectric microelectromechanical system microphone of claim 2 wherein the piezoelectric element is circular.

4. The piezoelectric microelectromechanical system microphone of claim 3 wherein the slits define at least three partial anchors.

5. The piezoelectric microelectromechanical system microphone of claim 3 wherein the slits are arcuate in shape.

6. The piezoelectric microelectromechanical system microphone of claim 5 wherein the plurality of partial anchors each extends over an arc length between 0° and 360°/N, where N is a total number of partial anchors in the piezoelectric microelectromechanical system microphone.

7. The piezoelectric microelectromechanical system microphone of claim 2 wherein the sensing electrode includes an inner sensing electrode disposed proximate a center of the diaphragm structure and an outer sensing electrode disposed proximate the perimeter of the diaphragm structure.

8. The piezoelectric microelectromechanical system microphone of claim 7 wherein the slits are defined in a region of the piezoelectric element surrounding the outer sensing electrode.

9. The piezoelectric microelectromechanical system microphone of claim 7 wherein the piezoelectric element is free of vent holes within a region inside a perimeter defined by the outer sensing electrode.

10. The piezoelectric microelectromechanical system microphone of claim 7 wherein the inner sensing electrode includes a first upper sensing electrode disposed on an upper surface of the piezoelectric element and a first lower sensing electrode disposed on a lower surface of the piezoelectric element.

11. The piezoelectric microelectromechanical system microphone of claim 10 wherein the outer sensing electrode includes a second upper sensing electrode disposed on the upper surface of the piezoelectric element and a second lower sensing electrode disposed on the lower surface of the piezoelectric element.

12. The piezoelectric microelectromechanical system microphone of claim 11 wherein the piezoelectric element includes an upper film of piezoelectric material and a lower film of piezoelectric material, an inner middle sensing electrode disposed between the upper film and lower film proximate the center of the diaphragm structure, and an outer middle sensing electrode disposed proximate the perimeter of the diaphragm structure.

13. The piezoelectric microelectromechanical system microphone of claim 1 wherein the slits are between 1 µm and 5 µm wide.

14. An electronics device module including the piezoelectric microelectromechanical system microphone of claim 1.

15. An electronic device including the electronic device module of claim 14.

16. A telephone including the electronic device module of claim 14.

* * * * *